United States Patent [19]

Lund et al.

[11] Patent Number: 4,908,688

[45] Date of Patent: Mar. 13, 1990

[54] MEANS AND METHOD FOR PROVIDING CONTACT SEPARATION IN SILICIDED DEVICES

[75] Inventors: Clarence A. Lund, Phoenix; Richard R. Hamzik, Changler, both of Ariz.

[73] Assignee: Motorola, Inc., Schaumburg, Ill.

[21] Appl. No.: 132,822

[22] Filed: Dec. 14, 1987

Related U.S. Application Data

[62] Division of Ser. No. 839,848, Mar. 14, 1986, Pat. No. 4,753,897.

[51] Int. Cl.$^4$ .................... H01L 27/02; H01L 27/78; H01L 27/12

[52] U.S. Cl. ................................. 357/41; 357/23.1; 357/23.9; 357/23.14; 357/42; 357/47; 357/49

[58] Field of Search .............. 357/41, 42, 23.1, 23.14, 357/23.9, 47, 49

[56] References Cited

U.S. PATENT DOCUMENTS

| | | | |
|---|---|---|---|
| 4,208,781 | 6/1980 | Rao et al. | 29/577 C |
| 4,300,152 | 11/1981 | Lepselter | 357/23.1 |
| 4,319,395 | 3/1982 | Lund et al. | 29/571 |
| 4,435,896 | 3/1984 | Parrillo et al. | 29/571 |
| 4,480,375 | 11/1984 | Cottrell et al. | 29/576 B |
| 4,497,043 | 1/1985 | Iizuka et al. | 357/41 |
| 4,503,601 | 3/1985 | Chiao | 29/571 |
| 4,528,744 | 7/1985 | Shibata | 29/571 |
| 4,621,276 | 12/1986 | Malhi | 357/42 |
| 4,623,909 | 11/1986 | Nishizawa et al. | 357/41 |
| 4,647,957 | 3/1987 | Coquin et al. | 357/23.11 |
| 4,672,584 | 6/1987 | Tsuji et al. | 357/42 |
| 4,692,781 | 9/1987 | Rountree et al. | 357/41 |
| 4,721,990 | 1/1988 | Kinoshita | 357/41 |
| 4,797,372 | 1/1989 | Verret et al. | 357/42 |

FOREIGN PATENT DOCUMENTS 0072690 2/1983 European Pat. Off. ............. 29/589
1502668 3/1978 United Kingdom .
1594562 7/1981 United Kingdom .

OTHER PUBLICATIONS

Jacob Millman, "Micro-Electronics, Digital and Analog Circuits and Systems", pp. 254–256, Copyright 1979, by McGraw-Hill, Inc.
Chen et al., "A New Device Interconnect Scheme for Sub-Micron VLSI", IEDM 84, pp. 118 to 121.
E. K. Broadbent et al., "Selective Low Pressure", Electrochem Soc., vol. 131, No. 6, pp. 1427–1432, Jun. 1984.
G. V. Samsonov et al., Germanides, Consultants Bureau, 1969, pp. 19–21.

Primary Examiner—Andrew J. James
Assistant Examiner—Ngan Van Ngo
Attorney, Agent, or Firm—Joe E. Barbee; Bob Handy

[57] ABSTRACT

A means and method for providing platinum or tungsten silicide contacts to source, drain, gate and tub regions of a dielectrically isolated MOSFET is described. A "false" gate is used to provide automatic self-aligned separation of the source-drain contact and the tub contact. An intermetallic forming material is uniformly coated over the doped substrate on which the gate and false gate region have been formed in a spaced-apart fashion. Upon heating the intermetallic forming layer reacts with the substrate and the polysilicon gates to form intermetallic regions. The remaining portion of the intermetallic forming layer is differentially etched away from the dielectric isolation walls and the sidewall oxides on either side of the gate and false gate. Alernatively, selective deposition may be used to avoid deposition on the dielectric regions. The false gate extends laterally across the isolation tub. This procedure separates the device contacts from the tub contact without the use of separate masking layers. A more compact structure is obtained.

5 Claims, 4 Drawing Sheets

MEANS AND METHOD FOR PROVIDING CONTACT SEPARATION IN SILICIDED DEVICES

This is a division of application Ser. No. 839,848, filed Mar. 14, 1986, U.S. Pat. No. 4,753,897.

BACKGROUND OF THE INVENTION

1. Field of the Invention

This invention relates in general to means and methods for providing closely spaced contacts in semiconductor devices and, more particularly, to means and methods for providing closely spaced contacts in semiconductor devices which employ intermetallic contact regions.

2. Background Art

It is desirable in the semiconductor art to be able to use intermetallic contact regions. These intermetallic contact regions can provide very low resistance ohmic contacts or, alternatively, can provide high quality Schottky contacts.

Intermetallics are generally formed by reacting one or more metallic elements with the semiconductor of choice. For example, in the case of silicon semiconductors, a wide variety of metals such as Pt, Mo, W, Ni, Ti, and Ta are but a few of the many silicide forming materials which are known. Platinum is a particularly convenient intermetallic forming element and is widely used.

A need that often arises in connection with high density integrated circuit structures employing dielectrically isolated semiconductor tubs, is to simultaneously make contact to the device regions within the tub and the tub itself. In the prior art, when silicides or silicide forming materials were employed as a part of the contact structured, additional masking steps were required in order to make separate, non-shorting contacts to the tub and the device regions contained therein. These extra masking steps add to the cost and complexity of the devices. In addition, each masking step requires that provision be made in the device layout for the necessary mask-to-mask alignment tolerance. This increases the area occupied for a given circuit function and further increases the cost. Thus, a need continues to exist for improved processes and structures in dielectrically isolated circuits employing intermetallic contacts which utilize minimum surface area and which can be fabricated with the fewest possible masking operations.

Accordingly, it is an objective of the present invention to provide an improved means and method for forming intermetallic contacts to semiconductor regions wherein separate masking operations for contacting the N and P regions are eliminated.

It is a further object of the present invention to provide an improved means and method for contacting semiconductor devices employing intermetallic contacts wherein N and P-type contacts may be brought as close as the minimum layout line width without requiring any provision for alignment tolerance.

It is an additional object of the present invention to provide an improved means and method for forming intermetallic contacts to semiconductor devices wherein the contacts to the N and P regions are self-aligned.

It is a further object of the present invention to provide the foregoing advantages simultaneously.

SUMMARY OF THE INVENTION

The attainment of the foregoing and other objects and advantages is achieved through the present invention wherein there is provided a means and method for forming semiconductor devices, comprising: providing a semiconductor substrate having a first surface; forming on the first surface at least first and second dopant blocking regions having respectively first and second lateral dimensions, wherein the first and second dopant blocking regions are separated by a first region of the substrate, and wherein a second region of the substrate is separated from the first region of the substrate by the second blocking region; providing a mask on the first surface which covers at least the second region of the substrate and which has an opening exposing at least the first region of the substrate; doping through this opening at least the first region of the substrate with a first dopant to a first predetermined dopant concentration, without substantially doping the second region of the substrate; removing the mask and doping the first and second regions of the substrate with a second dopant different than the first dopant, to a second concentration less than the first concentration; depositing an intermetallic forming layer simultaneously on the first and second regions of the substrate; and heating the intermetallic forming layer for a time sufficient to produce an intermetallic compound by reaction with the substrate.

Although generally useful, the means and method of the present invention are particularly well suited to the formation of MOS devices where the first blocking region is the gate of the MOS device, the first region of the substrate is the source and/or drain of the MOS device, and the second region of the substrate is the contact to the isolated tub in which the MOS device is being built. The second blocking region prevents the intermetallic forming layer from shorting together the source (or drain) contact and the tub contact. The second blocking region or "false gate" is conveniently formed at the same time and in the same manner as the gate of the MOS device. A lateral dielectric isolation wall can be provided surrounding the active device region to cut off lateral continuity with other semiconductor areas. The second blocking region or "false gate" runs laterally across the tub between the isolation walls.

A particular feature of the present invention is that the source and drain contacts are self-aligned to the gate and to each other, and to the tub contact. A further feature of the present invention is that no intermediate mask alignment steps are required to locate the tub contact region with respect to the source, drain, or gate. A further feature of the present invention is that the intermetallic forming layer may be deposited simultaneously on the source, drain, gate, and tub contact regions without shorting them together. Sidewall oxides are desirably used on the first and second blocking regions in order to increase the lateral separation of the intermetallic regions.

An additional feature of the present invention is that the source (or drain) and tub contacts may be brought extremely close together without shorting since the minimum separation is determined by the minimum line width layout rule being used. For example, the false gate can have the same lateral dimensions as the minimum active gate length.

The details of the present invention are more completely described in the figures and description which follow.

DETAILED DESCRIPTION OF THE DRAWINGS

For purposes of explanation, the device structures and methods presented herein are described for the case of silicon-based semiconductor devices and silicide intermetallic layers. However, those of skill in the art will understand that these means and methods apply to other semiconductor substrates and other intermetallic forming materials, and that the examples presented herein are shown merely as an aid to understanding and not intended to be limiting. Other semiconductor materials and intermetallics may also be used.

In FIGS. 1-11, unless otherwise noted, dielectric layers or regions are shown hatched, polycrystalline semiconductor regions are shown lightly stippled, intermetallic regions are shown heavily stippled, and single crystal regions, mask layers, and metal regions are shown clear. Arrows are used to indicate the implantation of various dopant species, however, those of skill in the art will understand that other doping methods could equally well be applied.

FIGS. 1-10 show, in simplified schematic cross-sectional form, elevation views of a portion of a semiconductor device formed according to the method of the present invention. The device structure illustrated is particularly suited to function as a MOS device having source, drain, and gate electrodes formed in a dielectrically isolated semiconductor tub to which a separate contact is provided. For ease of understanding, particular combinations of semiconductor conductivity types are illustrated. However, those of skill in the art will understand that different conductivity types could also be used.

Figure 1:
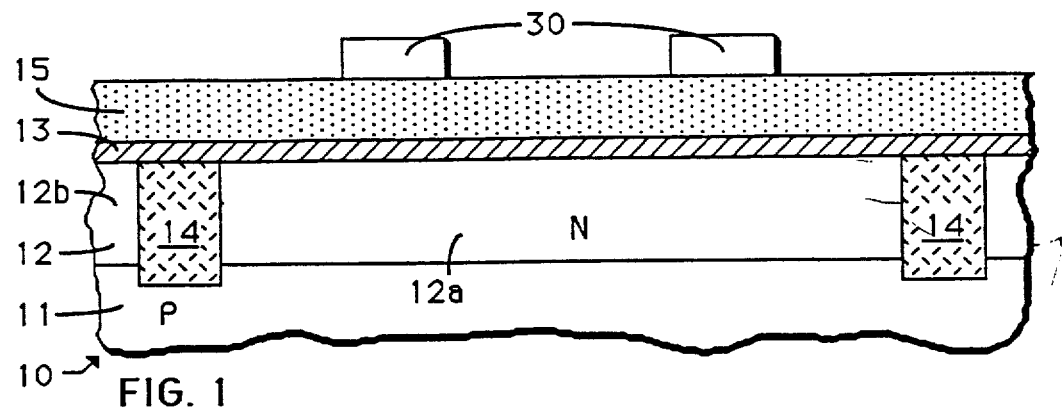

FIG. 1 shows semiconductor device portion 10 comprising P-type substrate 11 with surface layer or portion 12 in which have been formed dielectric isolation walls 14. Layer or portion 12 may be a separately formed epi-layer or merely the near surface region of substrate 11. For the purposes of this invention, layer or region 12 may be considered a part of substrate 11. N-type central region 12a has been provided within lateral isolation walls 14. Portions 12d of region 12 outside of isolation walls 14 may be doped N or P-type and may contain devices similar to or different than those intended to be formed in portion 12a. Surface layer or portion 12 is covered by dielectric layer 13 and conductor layer 15. Conductor layer 15 is conveniently formed of polycrystalline semiconductor material, e.g., polycrystalline silicon, but other conductive materials may also be used. Dielectric layer 13 is conveniently formed of silicon oxide or silicon nitride, but other dielectric materials may be used provided that they are compatible with the underlying semiconductor material. Surface layer or portion 12, doped region 12a, lateral dielectric isolation walls 14, and layers 13 and 15 are formed by means well known in the art. Layer 15 is conveniently about 0.1-1.0 microns thick with about 0.4 microns being typical. Layer 13 is conveniently about 0.01-1.0 microns thick with about 0.015 microns being typical where it is desired to use part of layer 13 as the gate of an MOS device.

Mask regions 30 are provided on layer 15. Photoresist is an example of a suitable material for mask region 30 but other material may also be used. Means for forming masking layers having particular open and protected regions are well known in the art. Layers 15 and 13 are etched through the openings in mask 30 so as to remove those portions of layers 13 and 15 not protected by mask 30. This leaves behind this structure illustrated in FIG. 2 wherein portions 13a-b and 15a-b remain on the surface of semiconductor substrate 11-12. Mask 30 is then conveniently removed.

For the example given, conductor portion 15b and dielectric portion 13b can serve as the gate conductor and gate dielectric of an MOS transistor. Conductor portion 15a and dielectric portion 13a, which may have the same lateral dimensions as gate 15b serve as a "false" gate to provide for separation of the contacts to tub 12a and the semiconductor device regions therein. For a small MOS device suitable for use in VLSI circuits, regions 15a-b are typically about 0.5 microns in lateral extent and separated by, typically, 1.5-2.5 microns, with about 1.0-2.0 microns between regions 15a-b and isolation walls 14. These dimensions are measured in the horizontal direction in FIGS. 2-11.

Figure 4:
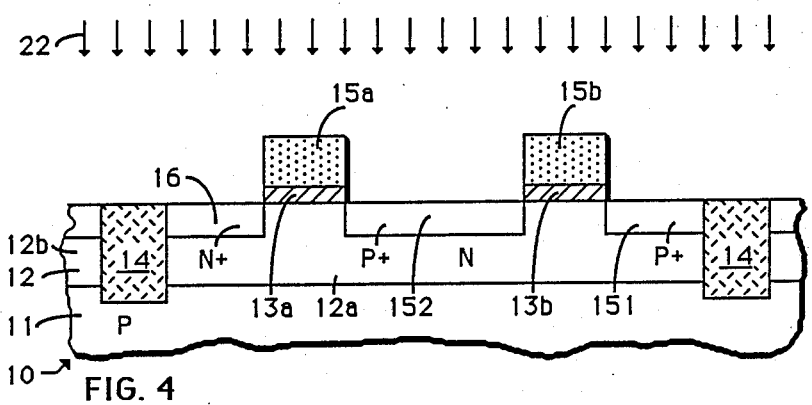
Figure 3:
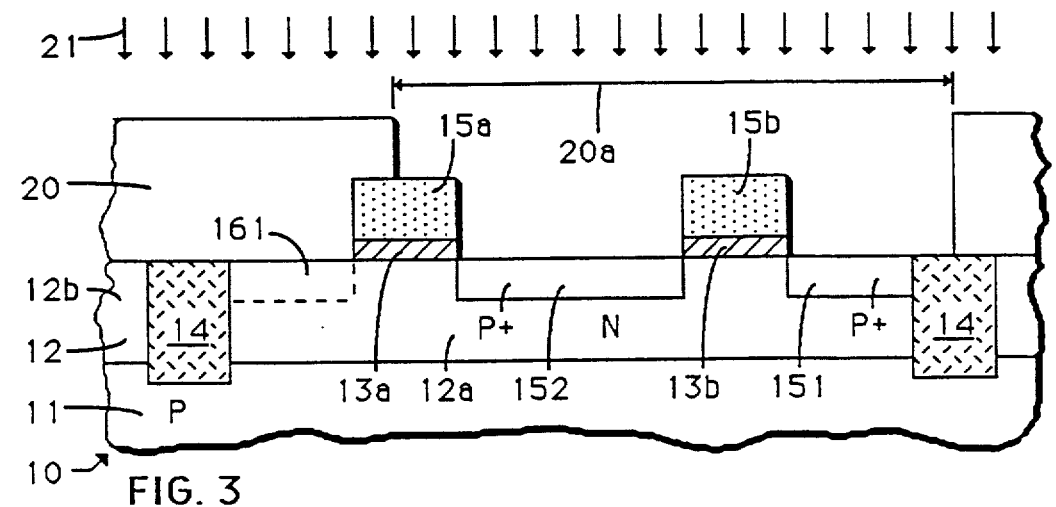

Source-drain regions 151, 152 and tub contact region 16 are provided as illustrated in FIGS. 3-4. The steps illustrated in FIGS. 3 and 4 may be performed in either order, that is, in the order shown by FIG. 3 followed by FIG. 4 or in the order shown in FIG. 4, followed by the steps shown in FIG. 3. Those of skill in the art will understand how the order of these steps may be interchanged. For purposes of further explanation herein, it is assumed that the steps of FIG. 3 are performed first.

In FIG. 3, mask 20 having opening 20a is applied. Opening 20a should encompass the desired location of source-drain regions 151, 152 on either side of gate region 15b. Mask 20 must cover region 161 in substrate 11-12 where the contact to tub 12a will subsequently be formed. Ions 21 are provided in FIG. 3 to dope regions 151-152. In the example shown wherein tub 12a is N-type, regions 151-152 are doped P-type. Polycrystalline semiconductor gate region 15b is doped at the same time, although this is not essential for the purposes of this invention. Some portion of false gate 15a may also be doped but this is not essential. It will be noted that regions 151, 152, 15a, 15b, and 161 are all self-aligned. Mask opening 20a need not be precision aligned since it is only necessary that it cover region 161. Where substrate 11-12 is of silicon, boron is a typical P-type dopant impurity. Regions 151-152 are conveniently formed by implanting boron to a concentration of about $1 \times 10^{15}$ ions/cm$^2$ at an energy of about 30 keV. Other doses and energies may also be used. If ion implantation is used as a means for providing doped regions 151-152, the implant energy must be sufficiently low so as not to cause penetration of ions 21 through gate region 15b. Those of skill in the art will understand how to choose the dose and energy to obtain the desired device characteristics. Alternatively, other doping techniques can also be used.

Any portion of mask 20 which remains after doping regions 151-152 is then removed. As shown in FIG. 4, dopant ions 22 are conveniently applied uniformly across substrate 11-12 so as to form N+ doped region 16 in portion 161 which had been previously covered by mask 20. At the same time that N+ region 16 is being formed, ions 22 are also being introduced in regions 151, 152 and 15b. Accordingly, the dose of ions 22 must be smaller than the dopant concentration used to form regions 151-152 so as to not counter-dope these regions. Where substrate 11-12 is silicon, typical implant conditions for forming regions 151-152 and 16 are, boron implant doses in the range $5 \times 10^{14}$ to $1 \times 10^{16}$ ions/cm$^2$ for regions 151-152 and arsenic or phosphorus ions implanted to a dose of a range $1 \times 10^{14}$ to $5 \times 10^{15}$ ions/cm$^2$ to form N+ region 16. Region 16 is typically doped to about one half or less of the concentration in P-region 151-152. The implant energy is selected to provide the desired doping depth. Those of skill in the art will understand how to do this. For the lateral device dimensions illustrated herein, regions 151, 152 and 16 conveniently have a depth less than or equal to about 0.2 microns. Generally, it is desirable that the junction depth of these regions be small compared to the lateral dimensions of regions 15a-b, so that the side diffusion from regions 151, 152, and 16 is a small fraction of the lateral width of regions 15a-b.

Figure 5:
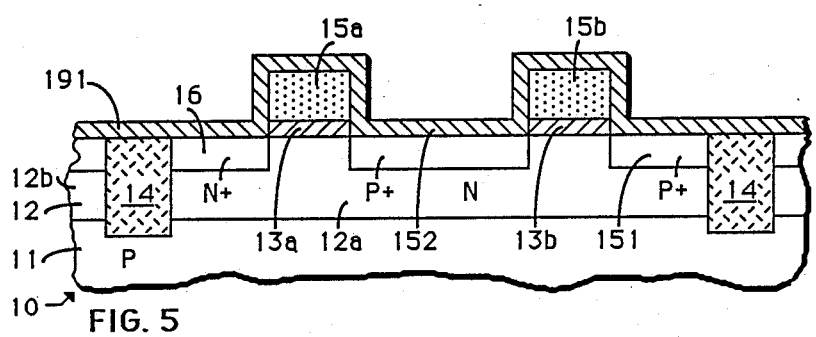

Doped substrate 11-12 and gate regions 15a-b are then conveniently covered with thin dielectric layer 191 (FIG. 5). Dielectric layer 191 should conformably coat the surface since it is intended to be used to form lateral oxide spacers on either side of gates 15a-b. The thickness of layer 191 is chosen to provide the desired lateral oxide sidewall spacing. Layer 191 may be of any convenient dielectric material. Silicon dioxide and silicon nitride are examples of suitable dielectric materials.

Layer 191 is then anisotropically etched so as to remove those portions of the layer which lie on the upper surface of substrate 11-12 and on the upper surface of gates 15a-b so that these upper surfaces are exposed. If the anisotropic etching process has a high vertical to horizontal etch ratio then the result of the anisotropic etching process will be to leave sidewall oxide portions 19 (FIG. 6) in place after the upper surfaces of substrate 11-12 and gates 15a-b are exposed. Suitable anisotropic etching techniques are well known in the art. Layer 191 is conveniently in the range of about 0.05-0.5 microns thick with about 0.1 microns being typical.

Figure 6:
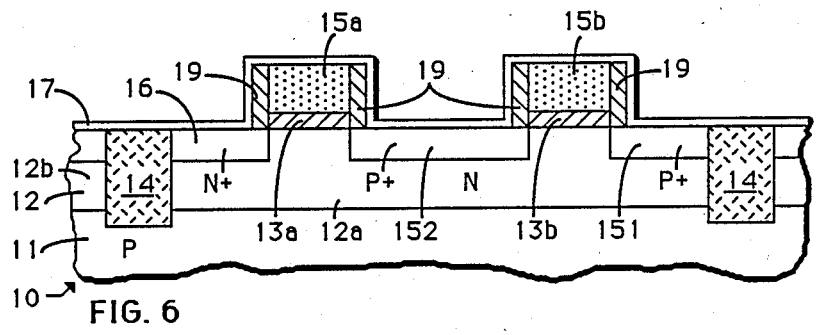

As shown in FIG. 6, the resulting structure is then covered with a thin intermetallic forming material. Platinum is an example of a material which is suitable for forming intermetallic compounds with silicon. Other materials are also known. When platinum is used, layer 17 is conveniently of a thickness in the range 0.01-0.1 microns with 0.03-0.06 microns being preferred and 0.05 microns being typical.

Figure 7:
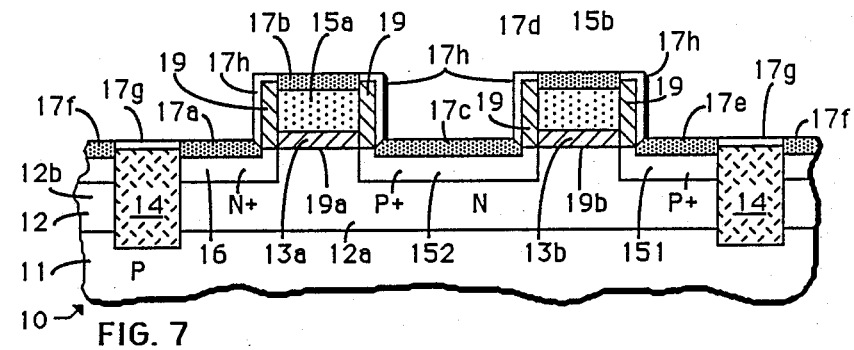

The structure shown in FIG. 6 is then heated to produce the structure shown in FIG. 7 wherein intermetallic forming layer 17 has reacted with the underlying semiconductor substrate 11-12 so as to form intermetallic regions 17a, 17c, 17e, and 17f on substrate 11-12, and has also reacted with polycrystalline semiconductor regions 15a-b to form intermetallic region 17b and 17d. Portions 17g and 17h of layer 17 which are in contact with dielectric isolation walls 14 and sidewall isolation regions 19 do not substantially react during this process.

A convenient property associated with many intermetallic compounds, of which platinum silicide is an example, is that their etch chemistry is significantly different than the etch chemistry of the original metal. This means that unreacted portions 17g-17h of layer 17 may be desolved away, as shown in FIG. 8, while leaving intermetallic regions 17a-f substantially undisturbed. It may be seen by inspecting FIG. 8, that even though intermetallic forming layer 17 was applied as a continuous sheet over the entire device, and initially shorts all the device regions together, following the previously described reaction and etching steps, isolated intermetallic contacts have been formed on each of the device regions of interest. For example, regions 17c and 17e provide contacts to source-drain regions 151, 152, region 17d provides contact to gate region 15b and region 17a provides tub contact 16. It will further be apparent, that false gate 15a prevents regions 152 and 16 from being shorted together.

Figure 9:
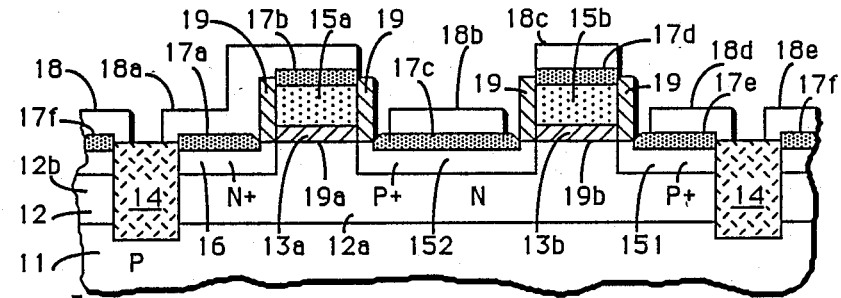

FIG. 9 illustrates the situation when conductor layer 18 has been provided and, using the masking techniques (not shown) well known in the art, patterned to provide contact 18a to intermetallic regions 17a and 17b, contact 18b to intermetallic region 17c, contact 18c to intermetallic region 17d and contact 18d to intermetallic region 17e. Conductor regions 18e may also contact intermetallic regions 17f which are laterally exterior to isolation walls 14, but that is not essential to the present invention.

Region 19b aligned between source-drain regions 151-152 can serve as the channel of an MOS transistor controlled by gate conductor 15b. The channel length corresponds to the lateral separation between regions 151-152, and the gate length corresponds to the width of region 15a, measured horizontally in the plane of FIGS. 2-10. Portion 19a of substrate 12 between regions 152 and 16 may be prevented from acting as a parasitic transistor by connecting false gate 15a to tub contact 16.

Figure 10:
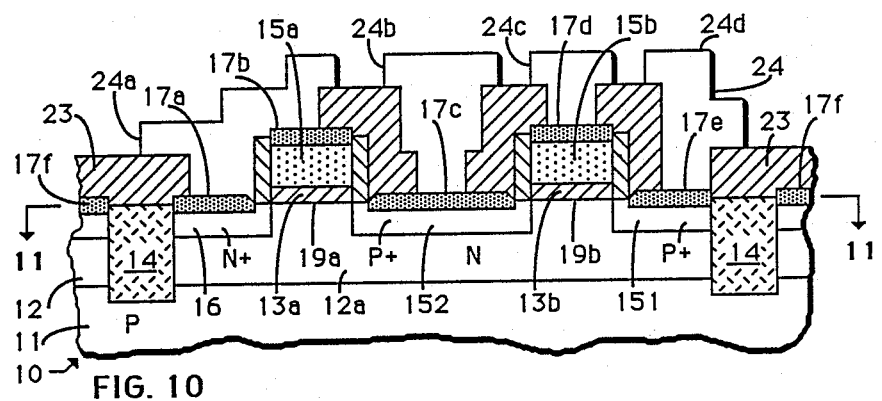

FIG. 10 illustrates an alternative embodiment in which dielectric layer 23 is applied over the structure of FIG. 8 and then patterned using means well known in the art to provide contact holes prior to the application of a surface conductor layer. As shown in FIG. 10, conductor layer 24 is then applied and patterned using means well known in the art to provide contact 24a to intermetallic regions 17a and 17d, contact 24d to intermetallic region 17c, contact 24c to intermetallic region 17d, and contact 24d to intermetallic region 17e. Intermetallic region 17f exterior to dielectric isolation walls 14 may or may not be connected at the option of the user.

Figure 11:
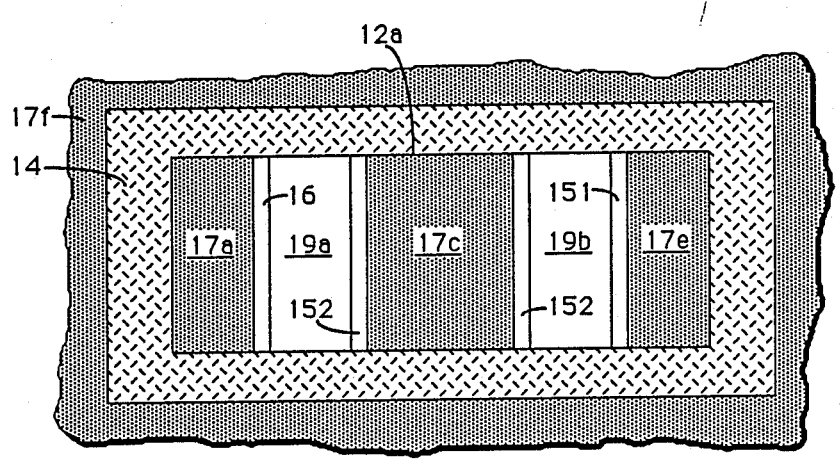
FIG. 11 shows a simplified schematic cross-sectional plan view of the portion of the semiconductor device shown in FIG. 10, at a particular location.

FIG. 11 is a plan cross-sectional view of the device of FIG. 10 approximately at the level of the surface of semiconductor substrate 11-12. Dielectric isolation wall 14 desirably has a closed shape so that tub 12a is laterally separated from the remainder of the device structure. It is convenient to have doped region 151 and intermetallic contact 17e, doped region 152 and intermetallic contact 17c, doped region 16 and intermetallic contact 17a extend across the width of tub 12a from isolation wall to isolation wall, i.e., in the vertical direction in FIG. 11. Device channel 19b under active gate 15b is visible in the right half of FIG. 11 and inactive region 19a under false gate 15a is visible in the left half of FIG. 11. It will be readily apparent from FIGS. 10-11 that false gate 15a prevents doped regions 152 and 16 and intermetallic regions 17c and 17a from shorting together. Further, since false gate 15a and active gate 15b are fabricated at the same time, they both can have minimum gate length, i.e., the lateral dimension of regions 15a-b measured in the horizontal direction in FIGS. 10-11. Accordingly, region 19a may be made as small as region 19b. Also, no alignment tolerance is required in order to place contact 16 in tub 12a while still avoiding shorts between contact 16 and region 152. Thus, the device may be built in a smaller area.

As those of skill in the art will appreciate, being able to make a separate low resistance contact (e.g., contact 17a, 16) to tub 12a is an important and convenient device feature. It is particularly useful where the device formed by regions 151, 152, 15b and 19b is intended to act as a transmission gate, that is, a device in which none of the terminals is grounded. In this situation, it is essential that region 152 not be shorted to tub contact 16. Such floating devices are also extremely useful in memory applications wherein it is desired to separately bias tub 12a with respect to channel 19b so as to be able to modulate the characteristics of the active device.

While the means and methods of the present invention have been illustrated for the case in which sidewall dielectric regions 19 have been included, they are not essential, and intermetallic forming layer 17 could equally well be placed directly upon substrate 11-12. In this case however, lateral isolation of, for example, intermetallic regions 17a and 17b is limited only to the thickness of dielectric region 13a. Where dielectric region 13a is particularly thin, this may be insufficient.

In a further embodiment of the invention, regions 17a-f may be formed by selective deposition of a conductive material. As will be further explained, tungsten is an example of such a material. Fabrication proceeds as has already been described in connection with FIGS. 1-6 through formation of side-wall dielectric regions 19. Silicon oxide is preferably used to form regions 19. Then, rather than depositing layer 17 (FIG. 6), reacting layer 17 with the underlying semiconductor to form intermetallic regions 17a-f (FIG. 7), and etching away unreacted regions 17g-h (FIG. 8), conductor regions 17a-f are formed by direct selective deposition, that is, deposition only on exposed semiconductor surfaces of regions 16, 151-152, and 15a-b, and not on side-wall oxide 19 or isolation walls 14. The structure of FIG. 8 is obtained directly by selective deposition of the conductive material without need for an intervening etching step. An intervening heating step may also not be necessary depending upon the desired amount of metal versus intermetallic desired in regions 17a-f.

Tungsten is an example of a conductor material known to selectively deposit on silicon and not on silicon oxide. The conditions necessary to obtain such selective deposition are well known in the art and are described for example by E. K. Broadbent in "Selective Chemical Vapor Deposition of Tungsten", *J. Electrochem. Soc.*, Vol. 131, #6, June 1984, page 1427. A portion of the deposition tungsten will react with underlying silicon regions 16, 151-152, and 15a-b. Unreacted tungsten will also be present in regions 17a-f. Those of skill in the art will understand that the relative proportions of tungsten and tungsten silicide in regions 17a-f will depend upon the temperature and duration of heating during and/or after deposition. Compared to silicon, both tungsten and tungsten silicide are highly conducting. Tungsten silicide is a known intermetallic. The surfaces of dielectric regions 19 and isolation walls 14 will remain substantially free of tungsten or tungsten silicide. Fabrication then proceeds as described in connection with FIGS. 9-10.

While the invented means and method has been illustrated in terms of silicon semiconductor substrates and polycrystalline silicon conductors, those of skill in the art will understand that other semiconductor materials could be used for substrate 11-12 and other conductors could be used for layer 15 and regions 15a-b. Further, those of skill in the art will understand that the particular device regions labeled P-type or N-type may be interchanged or otherwise modified. Additionally, those of skill in the art will understand that other intermetallic forming materials besides platinum or tungsten may also be used, provided that they do not react with the dielectric regions from which they must ultimately be removed so as to avoid shorting, or else react in such as way as to not provide a conductor layer on those regions. Also, other selectively depositing conductors could be used, such as for example, doped silicon. Further, those of skill in the art will appreciate that even though a MOS device was illustrated by way of example in describing the invention and that particular examples were given for various thicknesses and dimensions, that other device configurations, thicknesses and dimensions could be equally well be used, and that the means and methods of the present invention apply whenever it is desired to simultaneously make self-aligned intermetallic contacts to one or more active device regions and the semiconductor region or tub in which they are located, and that the false gate structure and method employed herein is equally applicable to such other device configurations. Accordingly, it is intended to include all such variations in the claims which follow.

We claim:

1. An MOS device structure comprising:
a semiconductor substrate of a first conductivity type having therein a first part for containing an MOS device;
an isolation means substantially laterally surrounding the first part of the substrate and having first and second opposed portions joined by third and fourth opposed portions;
a first doped region of a second, opposite, conductivity type, located in the first part extending between the first and second portions of the lateral isolation means;
a second doped region of the second conductivity type, located in the first part separated from the first doped region by a channel region and extending between the first and second portions of the lateral isolation means;
an active gate on an insulator and self-aligned above the channel region;
a third doped region of the first conductivity type, located in the first part separated from the first doped region by an electrically inactive region and extending between the first and second portions of the lateral isolation means;
an inactive gate on an insulator and self-aligned above the inactive region; and
an electrode shorting the inactive gate and the third doped region.

2. The device structure of claim 1 wherein the active and inactive gates extend between the first and second portions of the lateral isolation means.

3. The device structure of claim 2 wherein the second doped region abuts one of the third or fourth portions of the lateral isolation means.

4. The device structure of claim 3 wherein the third doped region abuts the other of the third or fourth portions of the lateral isolation means.

5. The device structure of claim 1 wherein the insulators above the channel region and above the inactive region have the same thickness.

* * * * *

UNITED STATES PATENT AND TRADEMARK OFFICE
CERTIFICATE OF CORRECTION

PATENT NO. : 4,908,688

DATED : March 13, 1990

INVENTOR(S) : CLARENCE A. LUND ET AL.

Figure 8C:
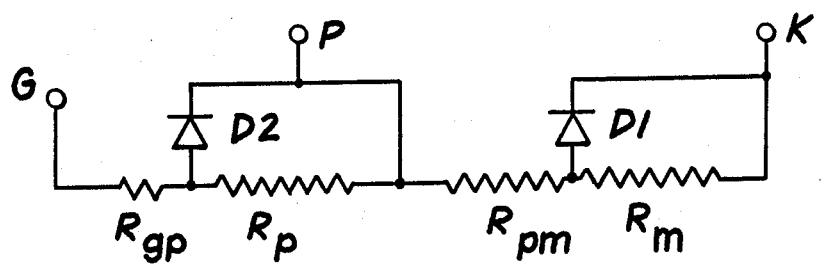
FIGS. 1-10 show simplified schematic cross-sectional elevation views of a portion of a semiconductor device fabricated according to the means and method of the present invention.
Figure 8D:
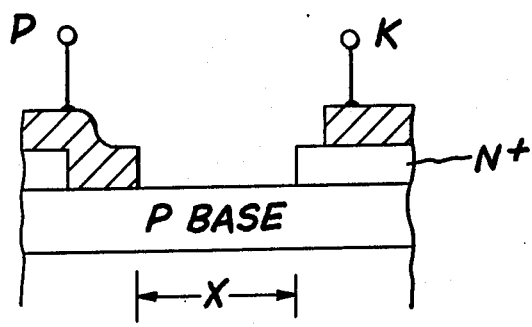
Figure 8E:
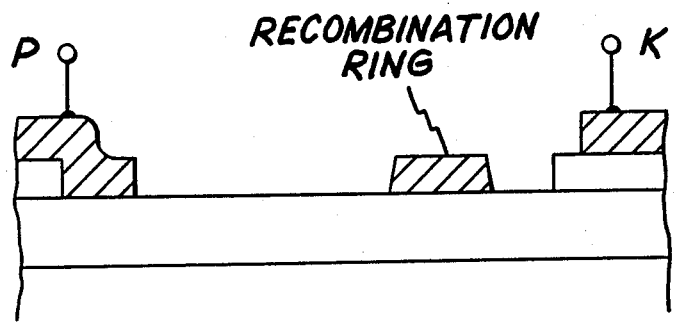
Figure 8:
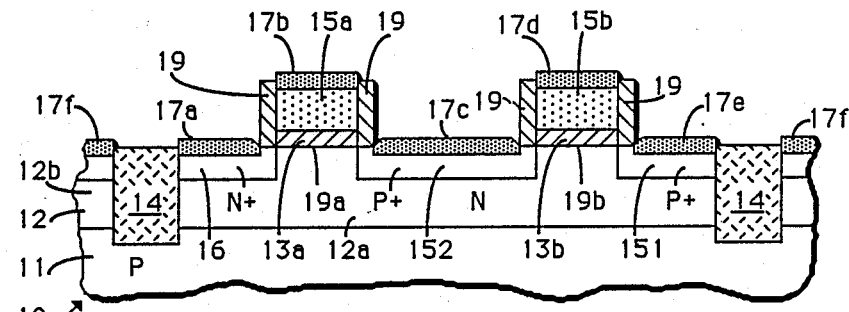
Figure 2:
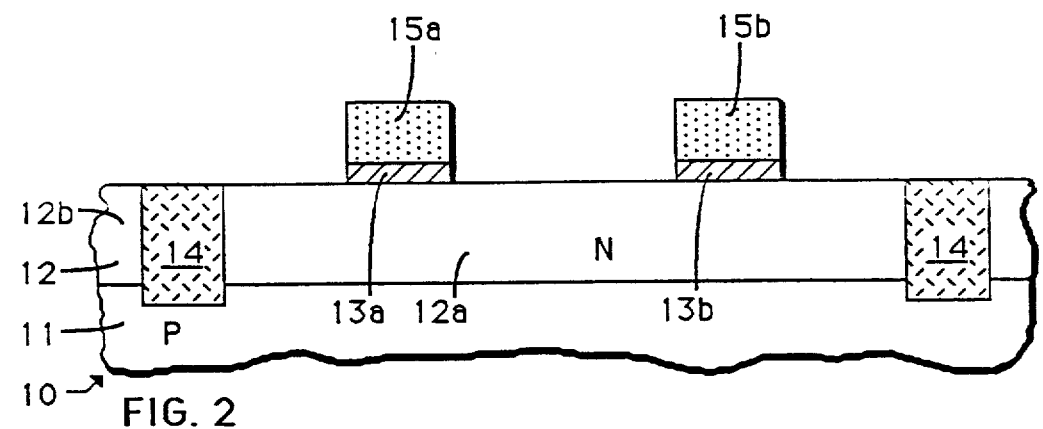

It is certified that error appears in the above-indentified patent and that said Letters Patent is hereby corrected as shown below:

Sheet 1 of the drawings, consisting of Figs. 8C, 8D and 8E, should be deleted to be replaced with the correct Sheet of drawings, consisting of Figs. 1, 2 and 3, as shown on the attached page.

Signed and Sealed this

Eleventh Day of October, 1994

Attest:

BRUCE LEHMAN

Attesting Officer

Commissioner of Patents and Trademarks